United States Patent [19]
Plummer, III et al.

[11] Patent Number: 5,545,844
[45] Date of Patent: Aug. 13, 1996

[54] QUICK ACCESS ELECTRICAL SHIELDING CHAMBER

[75] Inventors: Walter A. Plummer, III, Santa Ana; Vernon L. Shrader, Laguna Hills; Laurence R. Klein, Torrance, all of Calif.

[73] Assignee: The Zippertubing Company, Los Angeles, Calif.

[21] Appl. No.: 101,902

[22] Filed: Aug. 3, 1993

[51] Int. Cl.[6] ........................................ H05K 9/00
[52] U.S. Cl. ........................................ 174/35 MS
[58] Field of Search .................. 174/35 R, 356, 174/356 C, 35 MS; 361/816, 818; 428/209, 255, 256

[56] References Cited

U.S. PATENT DOCUMENTS

| | | | |
|---|---|---|---|
| 3,745,226 | 7/1973 | Nichols et al. | 174/35 MS |
| 4,729,326 | 3/1988 | Richter | 52/267 |
| 4,785,136 | 11/1988 | Mollet et al. | 174/35 R |
| 5,017,736 | 5/1991 | Yarger et al. | 174/35 MS |
| 5,043,529 | 8/1991 | Vanesky et al. | 174/35 MS |
| 5,045,636 | 9/1991 | Johnasen et al. | 174/35 MS |
| 5,136,119 | 8/1992 | Leyland | 174/35 R |

*Primary Examiner*—Kristine L. Kincaid
*Assistant Examiner*—Christopher Horgan
*Attorney, Agent, or Firm*—Christie, Parker & Hale, LLP

[57] ABSTRACT

An electrical shielding chamber has six electrically conductive rigid walls in electrical contact with each other. A first wall forms a first door and a second wall forms a second door, each of which is selectively attachable to at least three other walls. The chamber is collapsible for forming a substantially flat package, and expandable for forming a substantially electrically-shielded compartment.

25 Claims, 8 Drawing Sheets

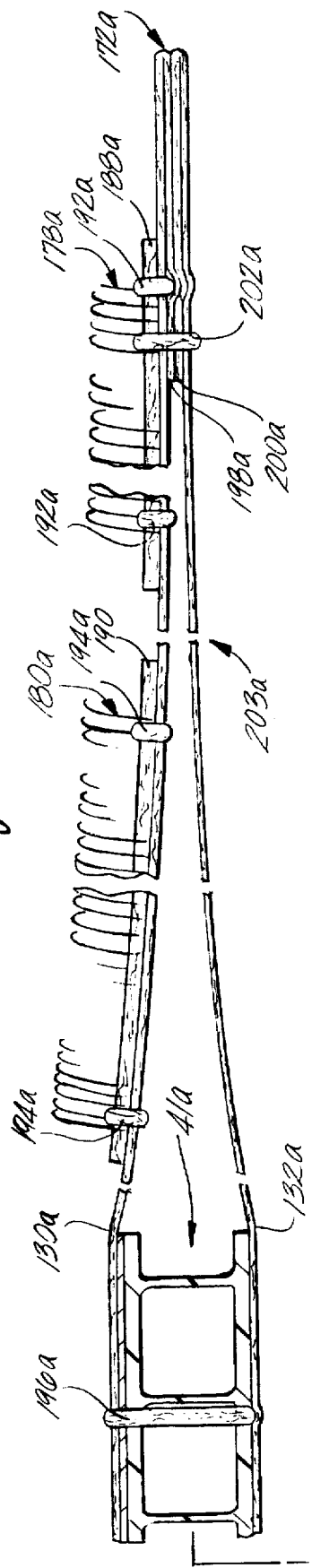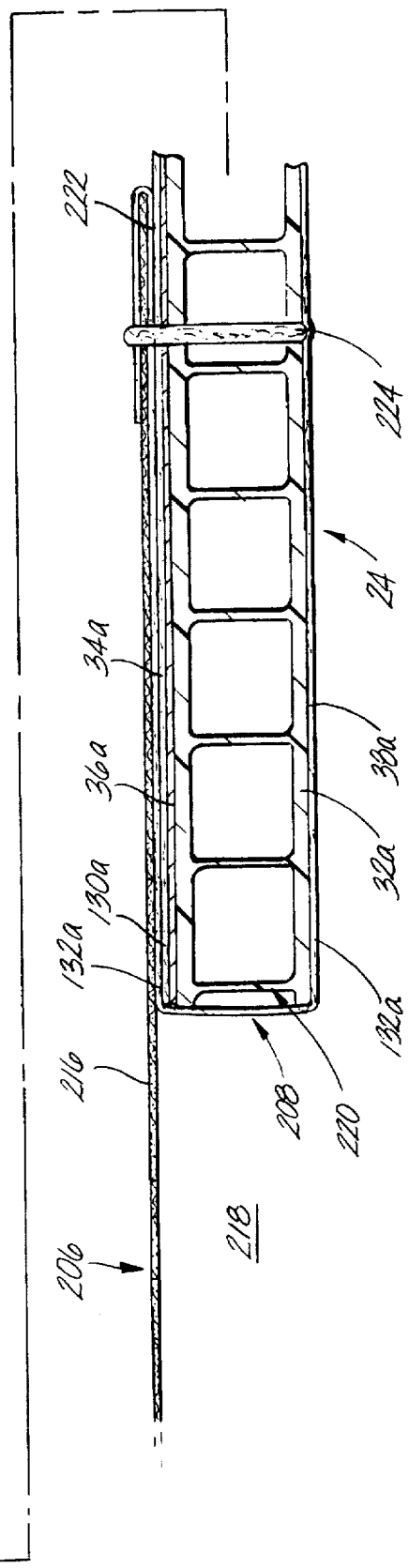
Fig. 4

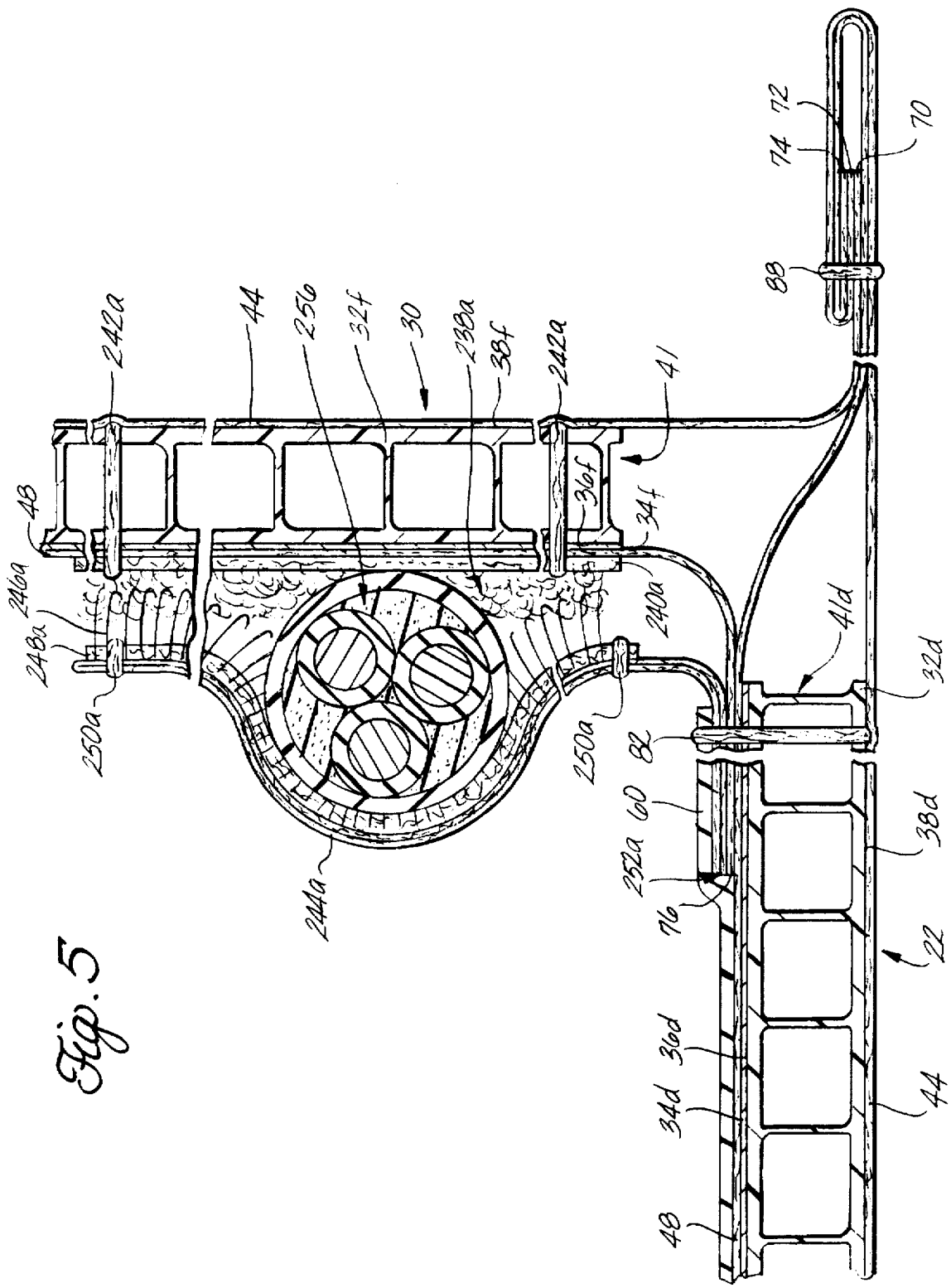

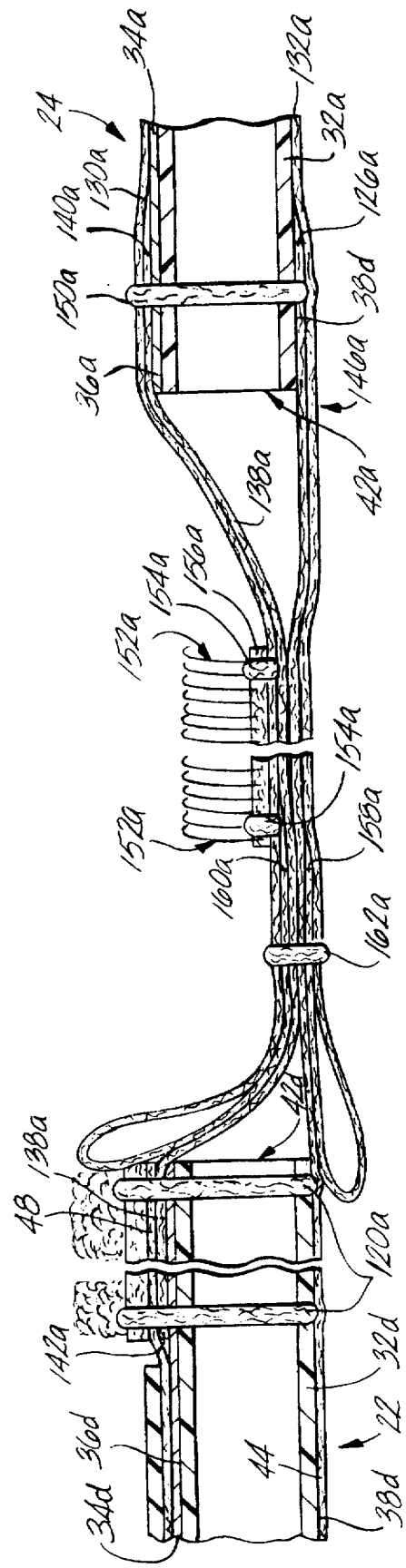

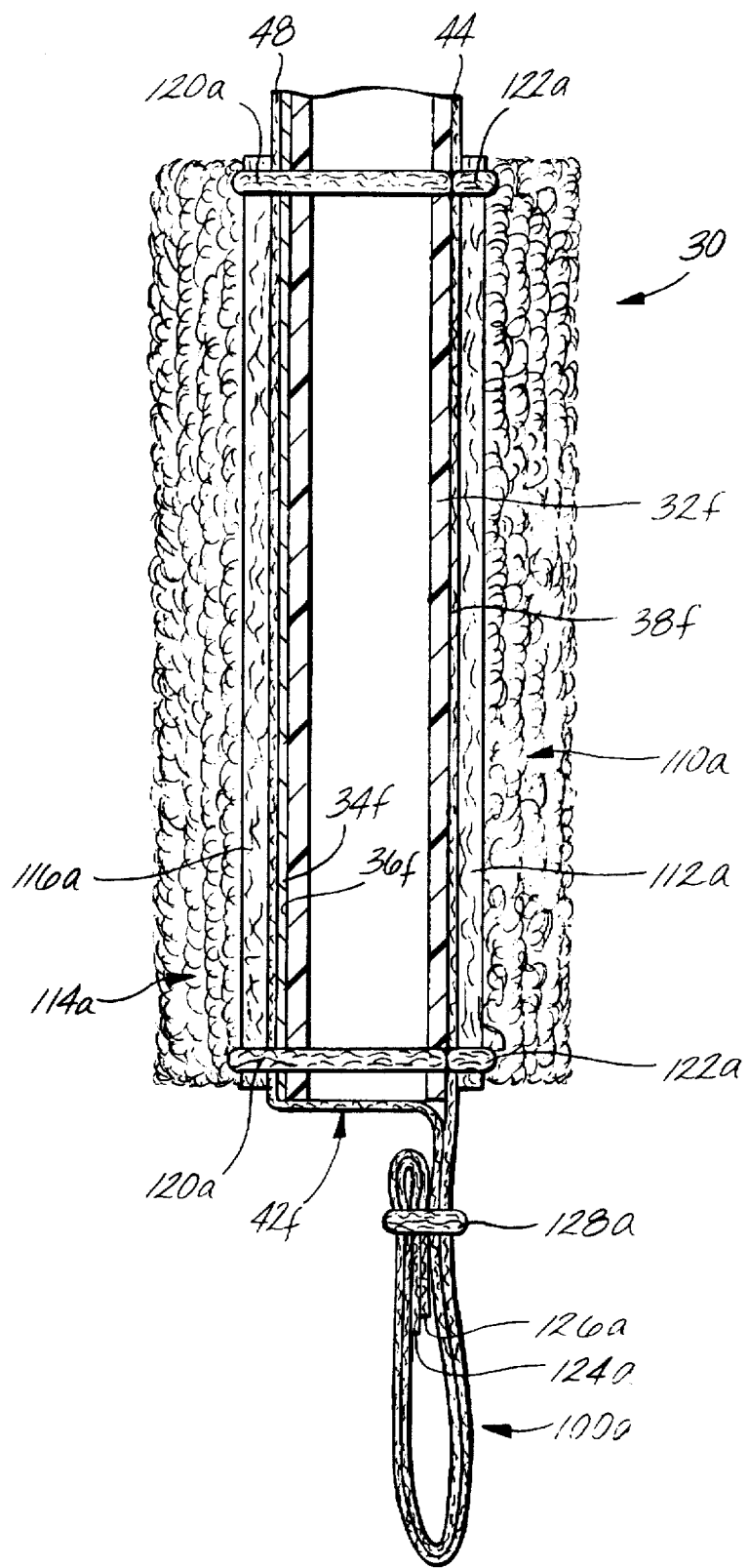

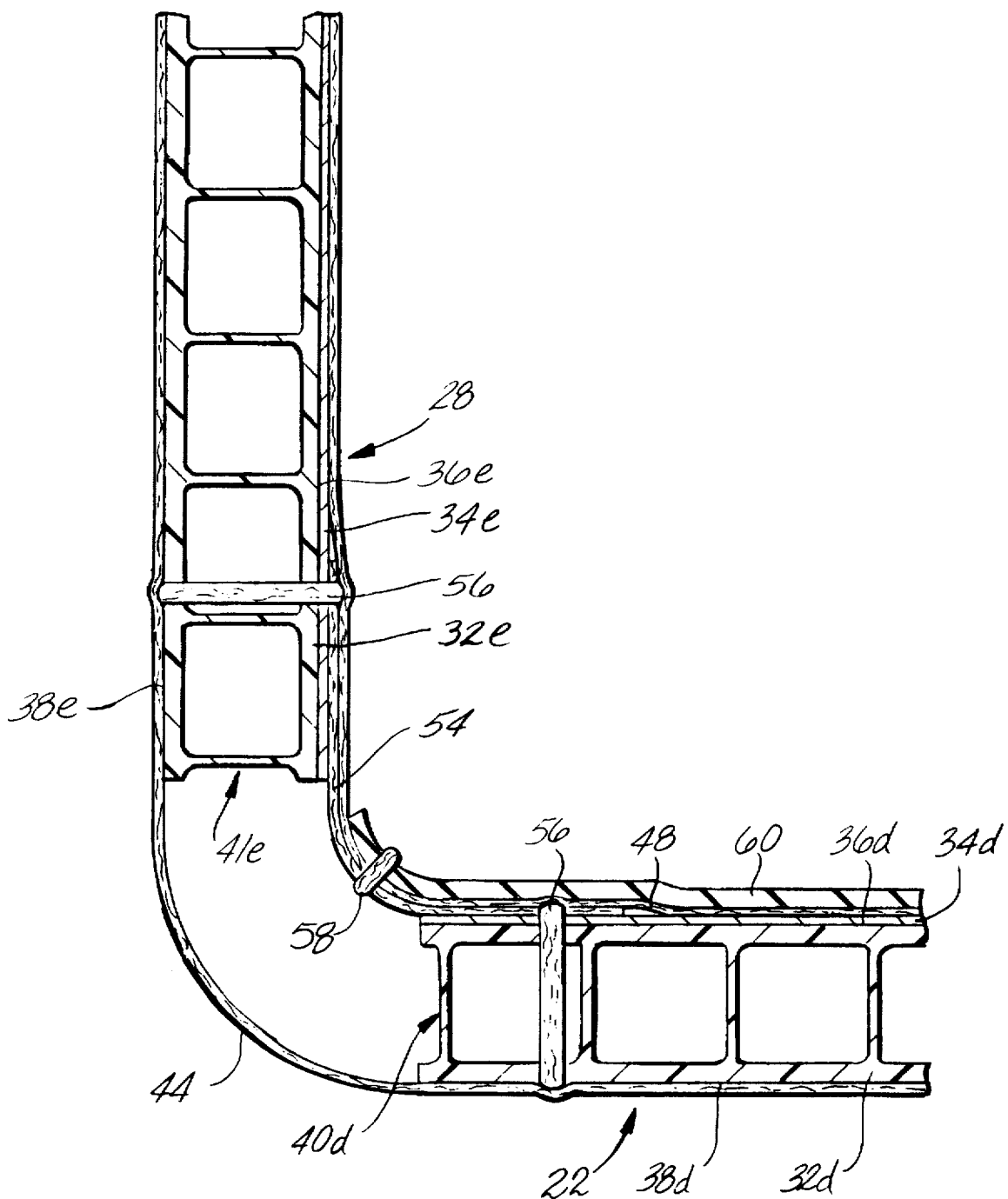

QUICK ACCESS ELECTRICAL SHIELDING CHAMBER

BACKGROUND OF THE INVENTION

The invention pertains to an electrical shielding chamber which is used to house electronic equipment when it is desired to protect equipment from external electromagnetic emissions and/or contain electromagnetic emissions from the equipment.

A common application for electrical shielding chambers is in the area of testing of electronic equipment. In such a case, measurements are often desired of electromagnetic emissions from the equipment without the presence of any background external emissions. In other cases, the sensitive nature of the equipment requires that external electromagnetic emission be shielded against. In other cases the operation of the equipment produces unwanted electromagnetic emissions which are intended to be contained by the shielding chamber.

Prior shielding chambers, often known as Faraday cages, have typically been large structures. Often the size of a room, such chambers are made using wire screening, grating, etc, to provide the desired electrical shielding. For certain applications, existing shielding chambers are non-optimal. In applications such as shielding chambers on ships, spacecraft or aircraft, premiums on weight and space place advantages on a light-weight and compact chamber. Additionally, such advantages may come into play with regard to a wide variety of field testing situations where portability is desired. For field testing, chambers are often jury-rigged from pieces of wire screening.

A computer terminal shielding cover utilizing metallized fabric has been proposed in U.S. Pat. No. 4,785,136. This appears less than adequate for shielding sensitive electronic devices.

SUMMARY OF THE INVENTION

Thus, there is provided in practice of this invention, according to a presently preferred embodiment, an electrical shielding chamber comprising six electrically conductive rigid walls in electrical contact with each other. A first wall forms a first door and a second wall forms a second door, each of which is selectively attachable to at least three other walls. The chamber is collapsible for forming a substantially flat package, and expandable for forming a substantially electrically-shielded compartment.

BRIEF DESCRIPTION OF THE DRAWINGS

These and other features and advantages of the present invention will be appreciated as the same becomes understood by reference to the following detailed description, when considered in connection with the accompanying drawings wherein:

FIG. 4 is a partial cross-sectional view of the front door of the shielding chamber of FIG. 2, taken along line 4—4 of FIG. 2;

FIG. 5 is a partial cross-sectional view of a corner of the shielding chamber of FIG. 1, showing wiring extending into the chamber, taken along line 5—5 of FIG. 1;

FIG. 6 is a partial cross-sectional view of the front door and bottom of the shielding chamber of FIG. 2, taken along line 6—6 of FIG. 2;

FIG. 7 is a partial cross-sectional view of the front edge of a side of the shielding chamber of FIG. 2, taken along line 7—7 of FIG. 2; and FIG. 8 is a partial cross-sectional view of the bottom corner of the shielding chamber of FIG. 2, taken along line 8—8 of FIG. 2.

DETAILED DESCRIPTION

Figure 1:
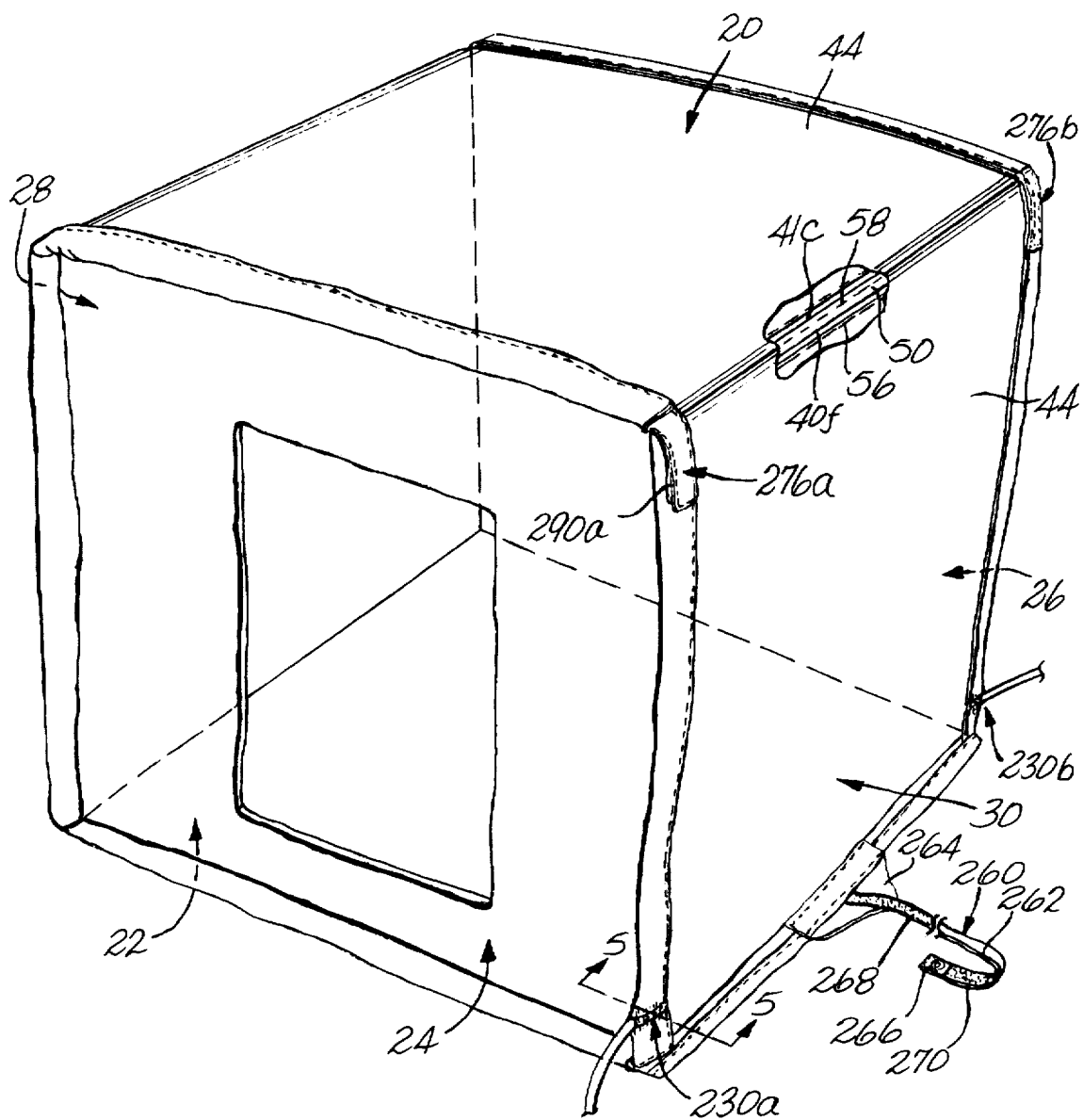
FIG. 1 is an isometric view of a shielding chamber constructed according to principles of the present invention.

An electrical shielding chamber is formed as an approximately cubic box having six electrically conductive, mutually perpendicular, rigid walls which more particularly are a top 20, a bottom 22, a front door 24, a back door 26, a left side 28 and a right side 30 in a configuration and orientation as shown in FIG. 1.

Figure 2:
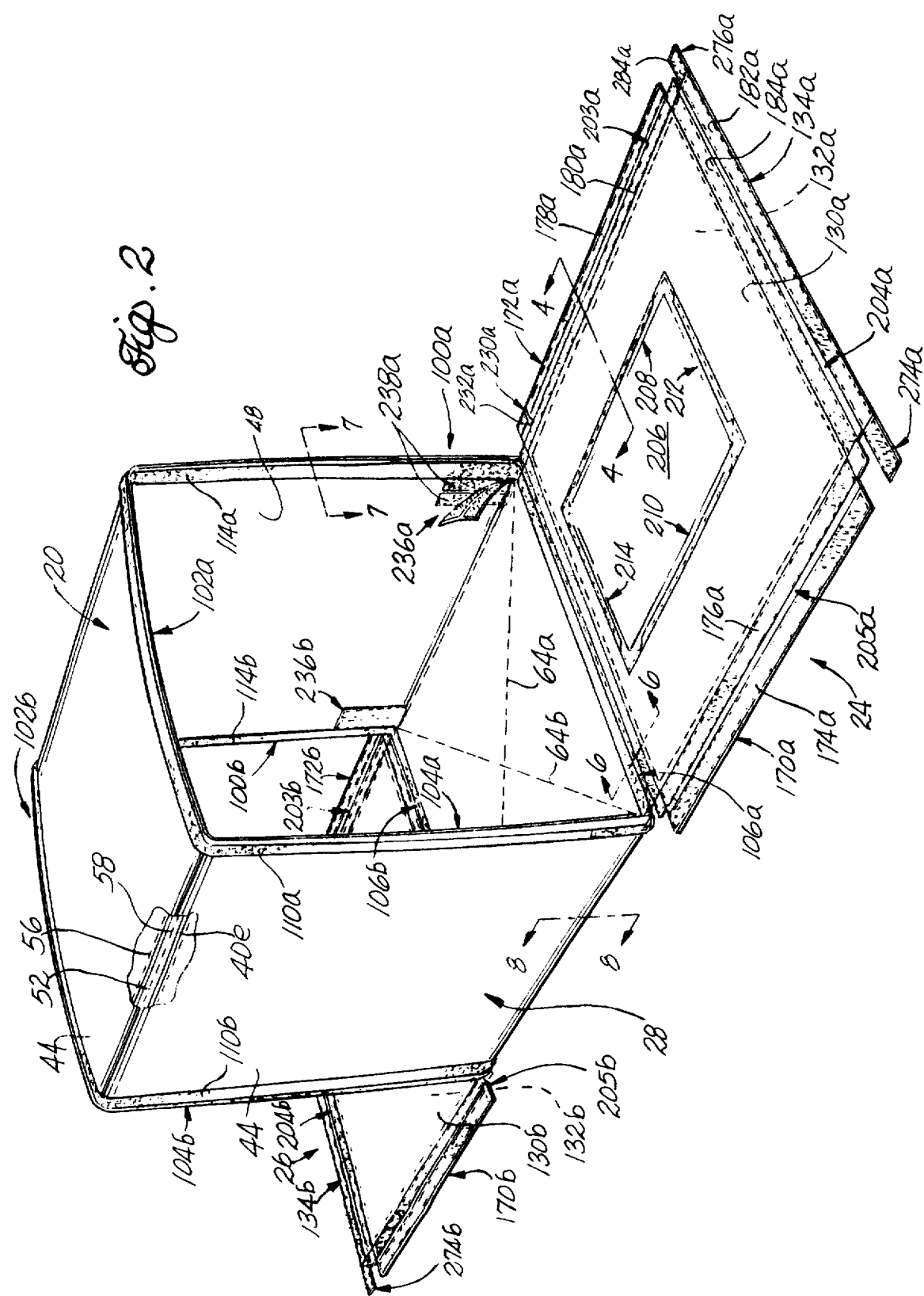
FIG. 2 is an isometric view of the shielding chamber of FIG. 1, with front and rear doors of the chamber shown open.
Figure 3:
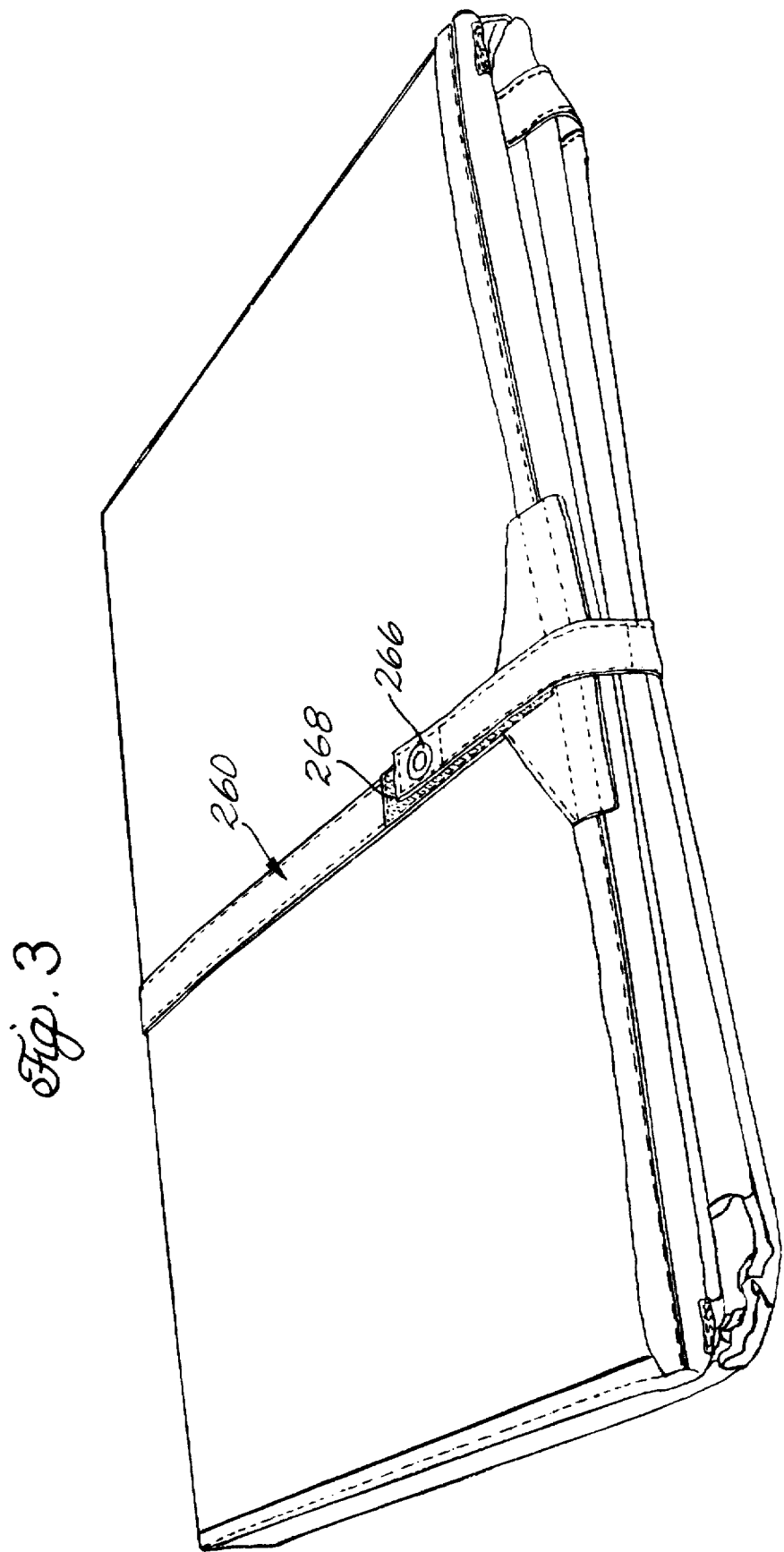
FIG. 3 is an isometric view of a shielding chamber in a collapsed or folded configuration.

As shown in FIG. 2, and further described below, the front and back of the chamber may be opened to provide access to the chamber as well as to allow the chamber to be collapsed and folded to a configuration such as shown in FIG. 3.

As it is readily apparent that there are a number of similar elements and features between the six walls generally and especially between the front and back doors, where appropriate, such elements are cited with a common numeral followed by a letter indicative of the specific wall. The letters chosen for the front door, back door, top, bottom, left side and right side are a, b, c, d, e and f, respectively.

Each of the walls contains a substantially rigid plastic panel for structure and support, with panels 32a, 32c, 32d, 32e and 32f shown in FIGS. 1, 2 and 4–8. Exemplary dimensions of the panels may be 61 centimeters square for the door panels and 66 centimeters long (front and back) by 61 centimeters wide so as to yield a nominally cubic chamber of approximately 0.37 cubic meters in capacity. The panels are of course scalable for the desired use and may be formed in rectangles of differing aspect ratios for producing non-cubic chambers. Each panel has inner and outer surfaces, first and second edges and first and second ends. Inner surfaces 36a, 36d, 36e and 36f and outer surfaces 38a, 38c, 38d, 38e and 38f are shown in the figures. A series of webs extend between the inner and outer panel surfaces to form corresponding channels within each panel. First and second edges (defined for purposes of illustration as being parallel to the panel channels) 40c, 40d, 40e and 40f and 41a, 41c, 41d, 41e and 41f are shown in the figures. Similarly, the ends (defined as perpendicular to the channels 42a, 42d, and 42f are shown in the figures. The distinction between edges and ends of the panels is made for purposes of illustration, as it is apparent that the invention may be practiced with the channels in any number of orientations. Affixed to each inner surface is a layer of aluminum, shown as 34a, 34d, 34e and 34f. The layers of aluminum provide substantially uninterrupted conductors encompassing a major portion of the periphery of the chamber. In the preferred embodiment the panels are formed of 4.8 millimeters thick plastic sheeting and the aluminum layers are formed from 0.076 millimeters thick adhesive-backed foil tape. If desired, a corrugated plastic sheet similar to corrugated cardboard, a plastic honeycomb material or other lightweight rigid material may be used for the plastic sheet.

Each of the walls has an outer layer and an inner layer of electrically conductive sheeting which form outer and inner surfaces of the walls. The outer layers of the left side, the top, the right side and the bottom are formed by a unitary outer fabric layer 44 encompassing each of those walls and positioned substantially adjacent the outer surfaces of their respective panels to cover the outer surfaces. Similarly, a unitary inner fabric layer 48 is positioned substantially adjacent to the inner surface (and aluminum layer) of each panel of those walls. Such woven fabric is typically nylon, polyester, or other fiber metallized with one or more layers of copper, nickel, copper-nickel alloy or other metal so as to be electrically conductive. Woven synthetic fiber fabric is preferred over woven wire mesh because of its flexibility and fine weave. It is also not subject to fatigue breakage upon repeated flexing.

Suitable metallized fabric is available from Monsanto under the product name FLECTRON. Exemplary material is a plain weave polyester taffeta having a thickness of about 170 micrometers and coated with a layer of oxidation resistant nickel over a layer of copper to provide a resistivity of less than 0.1 ohms per square (hereinafter, "the fabric"). Ripstop weave coated fabric may also be used. The double fabric layer construction separated by the nonconductive plastic portion of the panel provides a successive shielding effect. Additionally, it helps minimize any compromising of the shielding integrity resulting from tearing, wear or other damage to a single fabric layer. As further noted below, the construction is also useful to provide for stitching which only passes through one of the layers at a given point so that no direct path from outside the chamber to inside the chamber is established for passage of electromagnetic radiation.

As shown in cutaway in FIGS. 1 and 2 and in cross-section in FIG. 8, three flexible hinge strips 50, 52 and 54 formed of the fabric flexibly connect the panels of the right side and top, top and left side and left side and bottom, respectively. The hinge strips are attached to the panels along the panels' edge(s) by stitching 56. Additionally, the hinge strips are secured to the unitary inner fabric layer by stitching 58. The hinge strips contact the aluminum layers on the inner surfaces of adjacent panels establishing electrical contact between the aluminum layers. The hinge strips have an exemplary width of 5.7 centimeters with 2.5 centimeters of overlay on each adjacent panel so that a minimum 6 millimeters gap between the rigid plastic panels remains to facilitate folding of the chamber. The attachment of the hinge strips to the unitary inner fabric layer helps prevent shifting of the panels relative to the inner or outer fabric layers while maintaining the integrity of the outer fabric layer in the area.

A protective sheet 60 is positioned over the bottom 22 in contact with the unitary inner fabric layer. It is in part secured to the unitary inner fabric layer by the stitching 58 through the hinge strip 50 and additionally by diagonal stitching 64a and 64b through the panel 32d (FIG. 2). In the preferred embodiment, the protective sheet is formed of 0.4 millimeters thick polyurethane film. The protective sheet prevents equipment placed inside the chamber from wearing or otherwise damaging the unitary inner fabric layer and insulates the equipment from electrical contact with the chamber.

As shown in FIG. 5, the unitary outer fabric layer has a first side edge 70 extending beyond the bottom of the chamber and a second side edge 72 extending beyond the right side of the chamber. Similarly the unitary inner fabric layer has a first side edge 74 extending beyond the bottom and a second side edge 76 extending beyond the right side. The second side edge of the unitary inner fabric layer is tucked beneath the protective sheet adjacent the right edge 41d of the bottom panel. This second side edge is secured to the bottom via stitching 82 which penetrates from the protective sheet through to the outer surface of the bottom panel. Adjacent this second side edge, the unitary inner fabric layer is in contact with the unitary inner fabric layer adjacent the right edge of the bottom panel.

As further shown in FIG. 5, the unitary inner and outer fabric layers adjacent the first side edges thereof are placed substantially in contact with each other. The unitary outer fabric layer adjacent the second side edge thereof is located in contact with and on top of the unitary inner fabric layer as it extends from the bottom of the chamber. The first side edges are folded back over the second side edge of the unitary outer fabric layer and stitched through by stitching 88.

As shown in FIG. 2 and in detail in FIG. 7, along the front and back edges, 100a and 100b, 102a and 102b, and 104a and 104b, of the right side, top and left side walls, respectively, the unitary inner and outer fabric layers are stitched together and secured to the panels of said walls. Additionally, adjacent said front and back edges of the sides and top, exterior strips of hook and loop fastener 110a and 110b, respectively, are positioned against the unitary outer fabric layer. Adjacent the same front and back edges as well as adjacent the front and back edges 106a and 106b of the bottom, interior strips of hook and loop fastener 114a and 114b, respectively, are positioned against the unitary inner fabric layer. Velcro brand hook and loop fastener may be used.

Specifically, as shown in cross-section in FIG. 7, stitching 120a arranged in two rows extends through the backing tape 116a of the interior hook and loop fastener strip 114a, through the unitary inner fabric layer and through the plastic panel to its outer surface. Stitching 122a, also arranged in two rows, extends through the backing tape 112a of the exterior hook and loop fastener strip 110a and through the unitary outer fabric layer. Adjacent their respective front edges 124a and 126a, the unitary inner and outer fabric layers are placed in contact with each other, folded over and secured by stitching 128.

The front door 24 and back door 26 each have a piece of electrically conductive sheeting, formed of the fabric, folded along the upper edges 134a and 134b, respectively, of those walls to form inner fabric layers 130a and 130b and outer fabric layers 132a and 132b, respectively.

As shown in cross-section in FIG. 6, a first edge 140a of a front hinge strip 138a is positioned against the aluminum layer of the inner surface of the plastic panel of the front door and overlain by the inner fabric layer 130a of the front door. A second edge 142a of the hinge strip is positioned against the aluminum layer of the inner surface of the plastic panel of the bottom and overlain by the unitary inner fabric layer where it is secured to the bottom by the stitching 120a. The front and back door hinge strips have an exemplary width of 8.3 centimeters with a 2.5 centimeters overlap of the door and bottom panels to provide a 3.3 centimeters gap between the panels. At the base 146a of the front door, the front edge 126a of the unitary outer fabric layer 44 is positioned against the outer surface of the front door panel and is overlain by the front door outer fabric layer 132a. Stitching 150a extends through the inner fabric layer 130a, the hinge strip 138a, the front door panel and the unitary outer fabric layer. A strip of hook and loop fastener 152a is secured to the inner fabric layer 130a, between the front door panel and bottom panel, via stitching 144a which extends through the fastener backing tape 146a as well the inner fabric layer 130a. The outer and inner fabric layers of the front door are folded back, adjacent their lower edges 158a and 160a, onto the hinge strip and unitary outer fabric layer, respectively, and secured by a row of stitching 162a.

The front and rear doors have first and second edges 170a and 170b and 172a and 172b, respectively. As shown in FIG. 2, the front door has a first outboard hook and loop fastener strip 174a and a first inboard hook and loop fastener strip 176a along the door's inner fabric layer adjacent the door's first edge. Similarly, a second outboard hook and loop fastener strip 178a and a second inboard hook and loop fastener strip 180a are positioned adjacent the door's second edge. Furthermore, an upper outboard hook and loop fastener strip 182a and an upper inboard hook and loop fastener strip 184a are positioned along the door's upper edge. The hook and loop strips are secured to the door as shown in FIG. 4 with regard to the second edge 172a. Hook and loop strips 178a and 180a are secured through their respective backing tapes 188a and 190a to the inner fabric layer via stitching 192a and 194a, respectively. The unitary inner fabric layer is secured to the front door panel via stitching 196a. Edges 198a and 200a of the inner and outer fabric layers of the front door, respectively, are folded back onto the respective inner and outer layers and secured via stitching 202a, which also extends through the backing tape 188a. As shown in FIG. 4, the inner and outer layers of the front door form a flap 203a bearing the hook and loop strips 176a and 174a and extending beyond the panel's second edge 41a to the front door's second edge 172a. The front door has similar flaps 204a and 205a adjacent its upper edge and first edge, respectively, with the back door having similar flaps 203b, 204b and 205b.

The front and back edges of the top and side walls form front and back doorways for receiving the front and back doors, respectively. In the closed configuration, shown in FIG. 1, the doors are recessed in the respective doorways, with the flaps of the doors lapped over the edges of the walls forming the doorway so that each inboard and outboard strip of hook fastener engage, respectively, interior and exterior strips of loop fastener adjacent an edge of a corresponding wall. Additionally, the hook fasteners 152a, 152b engage loop fasteners 114a, 114b, respectively, along the bottom of the chamber. It is possible that the disclosed hinge arrangement at the lower edges of the doors might be replaced with a flap arrangement similar to that along the other three edges. In such a case the doors would be optionally removable and could effectively be treated as optionally hinged along any of the four edges by simply detaching the remaining three flaps from the three corresponding walls.

The front door is provided with a window 206 having right and left edges 208 and 210 respectively and top and bottom edges 212 and 214, respectively. Shown in FIG. 4 with regard to the right edge of the window, the window comprises a conductive mesh sheet 216 placed over an opening 218 in the front door panel formed between the inner and outer surfaces of the panel and having a right edge 220. The inner fabric layer 130a terminates adjacent the edge 220 whereas the outer fabric layer 132a has a portion 222 folded over the edge of the plastic panel and so as to overly the inner fabric layer adjacent the edge. The mesh then further overlies the outer fabric layer adjacent the folded portion 222 of the outer fabric layer. Finally, an edge of the outer fabric layer is folded over the mesh and stitched through to the outer surface of the panel by stitching 224. In the illustrated embodiment, the mesh is formed of a monothread polyester in a taffeta weave and coated with a continuous conductive layer of nickel. The weave is coarse enough to provide some visibility through the window.

As shown in FIGS. 1 and 2, slots 230a and 230b are formed in the flaps 203a and 203b of the front and back doors, respectively, extending inwardly from the second edges 172a and 172b. As shown with regard to the front door, the slot 230a extends through the second outboard hook and loop fastener strip 178a and has a rounded terminus 232a. The edges of the slot are overstitched to prevent fraying. The slots serve to permit wiring to pass into the chamber when the chamber is closed, as shown in FIG. 1 and described further below.

Front and back wire securing flaps 236a and 236b, respectively, are attached to the right side, adjacent the bottom and the respective strips of loop fastener 114a and 114b. As shown in FIGS. 2 and 5, the backing tapes 240a of a pair of hook and loop fastener strips 238a are secured via stitching 242a which extends through the tapes, the unitary inner fabric layer and the right side panel. The flap is formed of a folded piece of the fabric 244a (FIG. 5). The flap has two hook and loop fastener strips 246a, the backing tapes 248a of which are secured to the flap via stitching 250a. The flap is positioned so that the hook and loop fastener 246a faces the hook and loop fastener 238a. The near end 252a of the flap is secured beneath the protective plastic sheet and is substantially in contact with the unitary inner fabric layer adjacent its second side edge 76. The flap is secured to the bottom via stitching 82 which extends from the protective sheet through to the outer surface of the bottom panel. Wiring 256 may be placed between the flap and the right side. The flap is wrapped to encompass the wiring so that the hook and loop fastener 246a engages the hook and loop fastener 238a, thereby securing the wiring.

As seen in FIG. 1, a long grounding strap 260 is formed of an elongated folded strip 262 of the fabric stitched together and stitched at its near end to a folded base piece 264 of the fabric which in turn overlays and is at the unitary outer fabric layer above the stitching 88. The base piece is stitched through the folded unitary outer and inner fabric layers. A brass grommet 266 is located in the far end of the strap. One moiety of a hook and loop fastener strip 268 is secured along the upper surface of the strap at its near end. The other moiety of hook and loop fastener strip 270 is secured along the bottom surface of the strap adjacent the grommet. As described below, the hook and loop fastener on the grounding strap may be used to secure the chamber in a collapsed package.

The front and back doors each further include first and second ears 274a, 274b and 276a, 276b, respectively. Each ear is formed of a folded strip of the fabric extending from the upper edge door flaps 204a and 204b and is secured between the inner and outer layers of fabric forming the flap. The ears bear strips of hook and loop fastener along their respective inner surfaces. With the chamber in the closed configuration, the ears overlap the flaps of the first and second edges of the front and back doors with the ear hook strips engaging loop strips attached to the outer layers along the first and second edge flaps. As shown in FIG. 1, the hook strip 284a of ear 276a engages loop strip 290a. The remaining three ears function identically. The presence of the ears provides further electrical shielding adjacent the corners of the doors and helps secure the door flaps against disengagement from the top and sides of the chamber.

By disengaging respective hook and loop fastener strips, the chamber may be placed in a fully open configuration such as is shown in FIG. 2. The chamber may then be collapsed and folded to form a substantially flat package as shown in FIG. 3. This may be done such as by folding the doors beneath the bottom, folding the right side toward the inside of the bottom so as to come into contact with the protective sheet, folding the top and left side together to contact each other, and finally folding the top and left side beneath the doors. At this point, the grounding strap may be wrapped around the chamber so that the strap's hook strip 268 engages its loop strip 270 to securely bind the package. By reversing the steps, the chamber may be expanded so as to reform the electrically shielded compartment.

In operation, a piece of equipment (not shown) is placed in the chamber along with any necessary instruments (also not shown). Any necessary wiring for the equipment or instruments is secured by either of two wire securing flaps 236a or 236b, as previously described. The doors are closed with the wiring passing through the slot in the door adjacent the wire securing flap. The chamber is connected to an electrical ground via the grounding strap such as by securing the grommet to a ground source.

As is seen in various cross-sectional views of the drawings, the chamber is constructed so that no stitching completely pierces any of the walls to avoid compromising the shielding ability of the chamber. Use of the disclosed wire securing flaps minimizes any breach in shielding integrity associated with the path of the wiring entering the chamber.

In the illustrated embodiment, the various strips of hook and loop fastener are formed of one-inch (2.5 centimeters) nominal-width electrically conductive hook and loop fastener material available from Velcro USA, Inc. The various stitching is nylon sewing thread size 92 (0.0635 centimeters in diameter), meeting Federal Specification VT-295 Type II, Class A. For additional strength and improved electrical connection, the various strips of hook and loop fastener may be secured to the appropriate pieces of fabric by use of an electrically conductive adhesive. Attached pieces of the fabric may be similarly secured to each other. For abrasion resistance, a second protective sheet may cover the outer fabric layer along the bottom of the chamber or a suitable coating may be applied directly to the fabric of any or all of the walls.

As shown in certain of the isometric views of the drawings, many of the lines are not straight, but are rather somewhat irregular. This is done to properly illustrate a chamber which is formed substantially of fabric, hook and loop fastener and other materials which may not lend themselves to a rigid straight line representation. To more clearly show the features of the present invention, however, various elements are shown with exaggerated thickness and the spacings are not drawn to scale. Additionally, in the various cross-sectional views of the drawings, to properly show the penetration of stitching, the stitching is shown as if it is a straight line parallel to the plane of the view and without necessarily inducing deformation in the materials through which the stitching is placed.

In describing the invention, various indications of direction, such as left/right, top/bottom and front/rear, are used. These terms are used to more readily describe the invention when viewed in orientations as shown in the drawings. Clearly, the invention may be viewed in a variety of orientations, and, additionally, it can be seen that according to the invention, a shielding chamber may be constructed wherein the features described may exist in different orientations and configurations than those specifically shown. Furthermore, as the hook moiety and the loop moiety of hook and loop fastener may be generally be reversed in any given situation, the term "hook and loop fastener" should be treated as referring to the hook moiety, the loop moiety or any physically appropriate combination of the two.

What is claimed is:

1. An electrical shielding chamber comprising: first, second, third, fourth, fifth and sixth electrically conductive rigid walls in electrical contact with each other, wherein said first wall contains a first door and said second wall contains a second door and said first and second doors are each selectively attachable to at least three of said third, fourth, fifth and sixth walls;

wherein stitching through each of said walls is covered by a layer of metallized fabric on at least one side of the wall for preventing leakage of electromagnetic radiation; and wherein the chamber is collapsible for forming a substantially flat package and expandable for forming a substantially electrically shielded compartment.

2. An electrical shielding chamber comprising: first, second, third, fourth, fifth and sixth electrically conductive rigid walls in electrical contact with each other, wherein said first wall forms a first door and said second wall forms a second door and said first and second doors are each selectively attachable to at least three of said third, fourth, fifth and sixth walls; and first and second doorways formed by edges of the walls to which the first and second doors are selectively attachable for receiving the first and second doors, respectively, wherein the first and second doors are recessed in the first and second doorways when attached to the walls; and wherein the chamber is collapsible for forming a substantially flat package and expandable for forming a substantially electrically shielded compartment.

3. The electrical shielding chamber of claim 2 wherein one of the walls has inner and outer surfaces and bears a first hook and loop fastener strip along its inner and outer surfaces adjacent an edge which forms the first doorway and wherein the first door further comprises a flexible door flap which bears a second hook and loop fastener strip, the second hook and loop fastener strip of the flap being engageable with the first hook and loop fastener strip of said one of the walls for attaching the door to said one of the walls.

4. The electrical shielding chamber of claim 3 wherein the flexible door flap has a slot for receiving wiring.

5. The electrical shielding chamber of claim 4 further comprising a wall hook and loop fastener strip affixed to the inner surface of said one of the walls and a flexible securing flap having a flap hook and loop fastener strip, said flap hook end loop fastener strip and said wall hook and loop fastener strip being engageable with each other for encompassing and securing wiring.

6. The electrical shielding chamber of claim 1 wherein each of said walls comprises:

a substantially rigid panel having inner and outer surfaces;

an inner layer of metallized fabric covering the inner surface of the panel; and an outer layer of metallized fabric covering the outer surface of the panel.

7. The electrical shielding chamber of claim 6 wherein each of said walls further comprises a layer of metal affixed to one of the surfaces of the panel.

8. The electrical shielding chamber of claim 6 wherein the panel which forms the first door has a window formed between its inner and outer surfaces and the first door further comprises an electrically conductive mesh sheet positioned across said window.

9. The electrical shielding chamber of claim 8 wherein:

the inner layer of metallized fabric terminates adjacent the window of the panel;

the outer layer of metallized fabric has a folded portion which overlies an edge of the window and overlies the inner layer of metallized fabric adjacent the window; and the mesh sheet overlies the folded portion of the outer layer of metallized fabric and is secured to the panel by stitching.

10. The electrical shielding chamber of claim 9 wherein:

the inner layer of the third wall is formed unitarily with the inner layer of the fourth wall as a unitary inner fabric layer;

the outer layer of the third wall is formed unitarily with the outer layer of the fourth wall as a unitary outer fabric layer; and the chamber further comprises a first hinge strip of fabric, attached to the panels of the third and fourth walls along edges of each said panel and secured to the unitary inner fabric layer by stitching.

11. The electrical shielding chamber of claim 10 wherein:

the inner layers of the fifth and sixth walls are formed by said unitary inner fabric layer;

the outer layers of the fifth and sixth walls are formed by said unitary outer fabric layer; and wherein the chamber further comprises:

a second hinge strip of fabric, attached to the panels of the fourth and fifth walls along edges of each of the panels and secured to the unitary inner fabric layer by stitching; and a third hinge strip of fabric, attached to the panels of the fifth and sixth walls along edges of each of the panels and secured to the unitary inner fabric layer by stitching.

12. The electrical shielding chamber of claim 11 wherein one of the panels has an opening formed between its inner and outer surfaces and the chamber further comprises an electrically conductive mesh sheet positioned across said opening.

13. The electrical shielding chamber of claim 12 wherein the mesh sheet is formed of metallized polyester.

14. A portable electromagnetic shielding cage comprising:

a top wall, a bottom wall, a right side wall, a left side wall, a front wall and a back wall, each of the walls comprising a rigid nonconductive sheet material, a layer of metal, an inner layer of metallized fabric, and an outer layer of metallized fabric;

means for forming a flexible electrically conductive hinge between each said wall and at least one adjacent wall for (a) forming a door for placing instruments inside the shielding cage, and (b) folding all of the walls between a first position for forming a rectangular parallelepiped and a second position with the walls in face-to-face engagement for forming a flat package; and a flexible edge flap of conductive fabric along each hingeless edge of each of said walls, for overlapping an edge of the at least one adjacent wall for preventing leakage of electromagnetic radiation.

15. A shielding cage as recited in claim 14 comprising a first hook and loop fastener strip along each said flexible edge flap for securing adjacent walls together.

16. A shielding cage as recited in claim 14 wherein the means for forming a hinge comprises an inner conductive fabric extending between the inside faces of said adjacent walls and an outer conductive fabric extending between the outside faces of said adjacent walls.

17. A shielding cage as recited in claim 16 further comprising a window of electrically conductive mesh in at least one of the walls.

18. A shielding cage as recited in claim 14 further comprising an elongate electrically conductive strap in electrical contact with each of said walls.

19. A shielding cage as recited in claim 15 further comprising a flexible ear extending from a first flexible edge flap of a first wall of said walls and having a hook and loop fastener strip for engaging a hook and loop fastener strip on a second flexible edge flap of the first wall.

20. A shielding cage as recited in claim 14 further comprising a slot formed in the flexible edge flap along one edge of a of said walls which does not have at least one hinge for permitting the passage of wiring into the shielding cage.

21. A shielding cage as recited in claim 20 wherein each of said walls is square and the rectangular parallelepiped comprises a cube.

22. A shielding cage as recited in claim 21 wherein the inner and outer conductive layers of each of said walls each comprise a conductive fabric sheet.

23. The electrical shielding chamber of claim 2 wherein each of said walls comprises:

a substantially rigid panel having inner and outer surfaces;

an inner layer of metallized fabric covering the inner surface of the panel; and an outer layer of metallized fabric covering the outer surface of the panel.

24. The electrical shielding chamber of claim 23 wherein each of said walls further comprises a layer of metal affixed to one of the surfaces of the panel.

25. The electrical shielding chamber of claim 23 wherein a panel of the first door has a window formed between its inner and outer surfaces and the first door further comprises an electrically conductive mesh sheet positioned across said window;

the inner layer of metallized fabric terminates adjacent the window of the panel;

the outer layer of metallized fabric has a folded portion which overlies an edge of the window and overlies the inner layer of metallized fabric adjacent the window; and the mesh sheet overlies the folded portion of the outer layer of metallized fabric and is secured to the panel by stitching.

* * * * *

UNITED STATES PATENT AND TRADEMARK OFFICE
CERTIFICATE OF CORRECTION

PATENT NO. : 5,545,844
DATED : August 13, 1996
INVENTOR(S) : Walter A. Plummer, III; Vernon L. Shrader; Laurence R. Klein It is certified that error appears in the above-indentified patent and that said Letters Patent is hereby corrected as shown below:

Column 9, line 55, after "adjacent" insert -- said --.
Column 10, line 26, replace "edge of a of said walls which does not have at least one hinge" with -- edge of at least one of said walls which does not have a hinge --.

Signed and Sealed this

Nineteenth Day of August, 1997

*Attest:*

BRUCE LEHMAN

*Attesting Officer*    Commissioner of Patents and Trademarks